United States Patent [19]

Azuma et al.

[11] Patent Number: 5,266,508
[45] Date of Patent: Nov. 30, 1993

[54] PROCESS FOR MANUFACTURING SEMICONDUCTOR DEVICE

[75] Inventors: Kenichi Azuma, Tenri; Akio Kawamura, Nara, both of Japan

[73] Assignee: Sharp Kabushiki Kaisha, Osaka, Japan

[21] Appl. No.: 933,820

[22] Filed: Aug. 24, 1992

[30] Foreign Application Priority Data

Aug. 26, 1991 [JP] Japan .................................. 3-213535
Feb. 19, 1992 [JP] Japan .................................. 4-31860

[51] Int. Cl.$^5$ ......................................... H01L 21/265
[52] U.S. Cl. ...................................... 437/41; 437/44; 437/45; 437/913; 437/192
[58] Field of Search ....................... 437/40, 41, 44, 45, 437/29, 913, 192; 148/DIG. 82

[56] References Cited

U.S. PATENT DOCUMENTS

| 4,948,745 | 8/1990 | Pfiester et al. | 437/44 |
| 4,963,504 | 10/1990 | Huang | 437/44 |
| 4,971,922 | 11/9990 | Watabe et al. | 437/41 |
| 5,015,599 | 5/1991 | Verhaar | 437/44 |
| 5,061,647 | 10/1991 | Roth et al. | 437/41 |
| 5,082,794 | 1/1992 | Pfiester et al. | 437/40 |
| 5,102,815 | 4/1992 | Sanchez | 437/44 |

FOREIGN PATENT DOCUMENTS

| 0067734 | 3/1990 | Japan | 437/44 |
| 2-226726 | 9/1990 | Japan . | |
| 3-104125 | 5/1991 | Japan . | |

Primary Examiner—Brian E. Hearn
Assistant Examiner—Tuan Nguyen
Attorney, Agent, or Firm—Nixon & Vanderhye

[57] ABSTRACT

A process for manufacturing a semiconductor device which comprises the following steps of (i) forming a first insulating film on the whole surface of a semiconductor substrate having thereon a thin conductive layer with an intervening gate insulating film, (ii) removing the first insulating film at a channel region to cause the thin conductive layer to be exposed, thereby forming an opening portion, (iii) implanting ions in the opening portion to form a channel region in the substrate, (iv) forming a gate electrode of a conductive material in the opening portion, (v) removing only the first insulating film with leaving the gate electrode as it is and then implanting ions by using the gate as a mask to form a low carrier density region in the substrate, (vi) layering a second insulating film on the substrate including the gate and then carrying out an anisotropic etching to build a sidewall of the gate electrode, and (vii) implanting ions by use of the gate electrode and its sidewall as a mask to form a high carrier density region on the substrate, whereby completing an insulating gate type of field effect transistor having a low carrier density region for mitigating field effect, the low carrier density region adjoining to source and drain regions of high carrier density.

5 Claims, 2 Drawing Sheets

PROCESS FOR MANUFACTURING SEMICONDUCTOR DEVICE

BACKGROUND OF THE INVENTION

1. Field of the Invention

The invention relates to a process for manufacturing a semiconductor device, and more particularly to a process for manufacturing a field effect transistor of insulating gate type comprising a structure including Source and Drain regions of high carrier density and a separate region of low carrier density adjoining to the source and drain regions for mitigating the field effect.

2. Description of the Related Art

The insulating gate type of field effect transistor broadly used now in semiconductor integrated circuits has a steep electric field along channel regions due to the trend of subminiaturization of devices. It is a problem that hot carrier generated by the steep electric field deteriorates properties of devices. The problem may be solved by the so-called lightly doped drain structure (LDD) which is provided with a separate region of low carrier density between source and drain regions of high carrier density and channel region under gate electrode in order to mitigate concentration of electric field on and near the boundary of the channel region and drain region subjected to high voltage. The LDD structure has yet a problem of drop of drive current since the low carrier density region behaves as parasitic resistance. The low carrier density region may be modified and formed, as proposed in Japanese Unexamined Patent Publication No. Hei 2-226726 (1990) or Hei 3-104125 (1991), by overlapping the gate and drain regions and making use of difference of film thickness with inverted T-shaped gate electrode (reference '726) or providing a provisional gate (reference '125).

It is rather difficult in the first reference to control work for the inverted T-shaped gate electrode. Also, the second reference which includes a forming process of the provisional gate requires plural times of photolithographic process, leading to an increase of the total number of specific processes.

SUMMARY OF THE INVENTION

The present invention has been designed to overcome the above problems of the LDD structure by performing a photolithographic process one time for forming gate electrode. An object of the invention is to provide formation of a gate/drain overlapping structure and channel injection only under the gate electrode, each process carried out in a self-alignment process based on the single photolithographic process.

According to the present invention, it provides a process for manufacturing a semiconductor device which comprises the following step of (i) forming a first insulating film on the whole surface of a semiconductor substrate having thereon a thin conductive layer with an intervening gate insulating film, (ii) removing the first insulating film at a channel region to cause the thin conductive layer to be exposed, thereby forming an opening portion, (iii) implanting ions in the opening portion to form a channel region in the substrate, (iv) forming a gate electrode of a conductive material in the opening portion, (v) removing only the first insulating film while leaving the gate electrode as it is and then implanting ions by using the gate electrode as a mask to form a low carrier density region in the substrate, (vi) layering a second insulating film on the substrate including the gate electrode and then carrying out an anisotropic etching to build a sidewall of the gate electrode, and (vii) implanting ions by use of the gate electrode and its sidewall as a mask to form a high carrier density region on the substrate. Alternatively, the above process can be modified by conducting a step (i)' of implanting ions on a semiconductor substrate before the step (i) and omitting the ion implanation in the step(v).

DETAILED DESCRIPTION OF THE PREFERRED EMBODIMENT

Figure 1A:
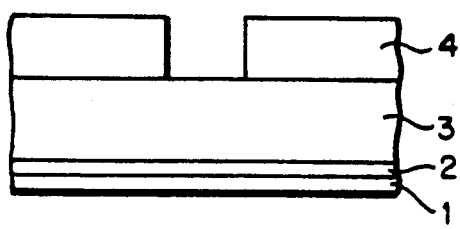
FIGS. 1(a)-(f) are schematic diagrams clarifying the specific manufacturing steps of the semiconductor device according to the present invention.

The substrate may preferably use a substrate of Si. In addition the substrate implanted with ions of n-type impurity may be used. A gate insulating film of e.g. $SiO_2$ and 5-15 nm in thickness is formed on the substrate by a thermal oxidation process or the like. A thin conductive layer, for example an $n^+$ poly Si layer, of 5-15 nm in thickness is then formed by CVD process or the like. A first insulating film of $SiO_2$ or the like and 0.2-1.0 $\mu$m in thickness is further layered on the whole surface of the substrate by CVD process.

Photo-resist is coated on the first insulating film to form a photo-resist pattern by photolithographic process. The first insulating film is then subjected to anisotropic etching to cause the poly Si layer to be exposed, forming an opening portion before removal of the photo-resist pattern.

Next, for instance p-type impurity ions are implanted at 20-40 KeV and dosed of $1 \times 10^{12}$–$5 \times 10^{12}$ ions/cm$^2$ using the first insulating film as a mask to form a channel region. The p-type impurity may use boron, indium or the like.

A conductive layer, for example a poly Si, of 0.2-1 $\mu$m in thickness is then deposited by CVD process on the thin conductive layer and first insulating film, followed by etching back to leave the poly Si layer in the opening portion of the first insulating film to form a polysilicon gate electrode. Alternatively, a conductive material, such as polysilicon or tungsten may be selectively grown on the foregoing thin polysilicon film to form a film of 0.2-1 $\mu$m in thickness for behaving as the gate electrode.

The insulating film only is then removed by solvent treatment (e.g. hydrofluoric acid) and n-type impurity ions are implanted at 40-80 Kev and doses of $1 \times 10^{13}$–$5 \times 10^{13}$ ions/cm$^2$ using the polysilicon gate electrode as a mask to form n-type low carrier density region on the substrate. The n-type impurity may use phosphorus, arsenic or the like. This implanation of n-type impurity ions can be omitted when the substrate beforehand implanted with such impurity ions is used.

A second insulating film of $SiO_2$ and 0.06-0.2 $\mu$m in thickness is deposited and etched back to leave the second insulating film only on the sides of the polysilicon gate, forming a sidewall of the gate.

The thin poly Si layer is etched by using the sidewall as a mask and n-type impurity is implanted at 50-150 Kev and doses of $1 \times 10^{15} - 5 \times 10^{15}$ ions/cm$^2$ using the sidewall as a mask to form n-type high carrier density region on the substrate. The n-type impurity may use phosphorus, arsenic or the like.

The gate electrode 6 is provided with wiring by sputtering process to complete an insulating gate type of field effect NMOS transistor having the gate/drain overlapping structure.

The manufacturing process for transistors according to the present invention is applicable also to PMOS transistors.

As seen from the above, the present invention can provide a transistor which is superior in resistance to hot carrier to be of higher reliability thanks to the gate/drain overlapping structure. Also, channel implantation is carried out only at the channel region, so that density of impurity at the junction of source and drain is not required to be unnecessarily increased, thereby allowing junction leakage to be reduced. Junction capacitance can be also reduced effectively. Furthermore, the invention uses the self-alignment process wherein formation of the gate/drain overlapping structure and channel implantation only under the gate electrode are carried out by a single photolithographic process, so that decrease of cost to produce and increase of yield can be achieved thanks to reduction of the total number of specific processes. Also, a single photolithographic process may be carried out for both of the channel implantation and polysilicon gate forming, thereby enabling the insulating gate type of field effect transistor to be provided in the self-alignment manner.

Next, examples of the present invention will be detailed. The invention should not be limited to the scope of the examples.

As shown in FIG. 1(a), a gate insulating film 1 of 100 Å in thickness was first formed on a Si substrate 11 by thermal oxidation process, on which a thin polysilicon film 2 of 200 Å in thickness was provided by CVD process. An insulating film 3 of SiO$_2$ and 0.2 μm in thickness was then layered by CVD process, on which photo-resist was coated to form a photo-resist pattern 4 by photolithographic process.

Figure 1D:
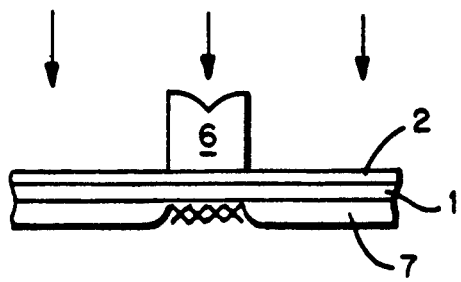
Figure 1B:
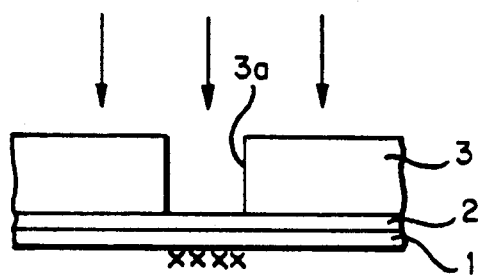

The insulating film 3 was then subjected to anisotropic etching to cause the polysilicon film 2 to be exposed, forming an opening portion 3a before removal of the photoresist pattern 4, followed by application of boron (p-type impurity) at 25 KeV and doses of $2 \times 10^{12}$ ions/cm$^2$ by use of the insulating film 3 as a mask (See FIG. 1(b)).

Figure 1E:
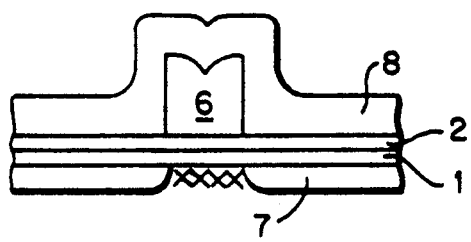
Figure 1C:
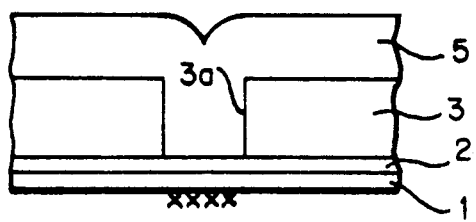

A polysilicon film 5 of 0.2 μm in thickness was deposited by CVD process on the thin polysilicon film 2 and insulating film 3 (See FIG. 1(c)).

The films were etched back to allow a polysilicon film 6 to be left in the opening portion 3a of the insulating film 3, forming a gate 6 of polysilicon.

Only the insulating film 3 was removed by solvent of hydrofluoric acid and phosphorus (n-type impurity) was applied at 55 KeV and doses of $3 \times 10^{13}$ ions/cm$^2$ by use of the polysilicon gate 6 as a mask to form n-type low carrier density region 7 on the Si substrate 11 (See FIG. 1(d)).

Figure 1F:
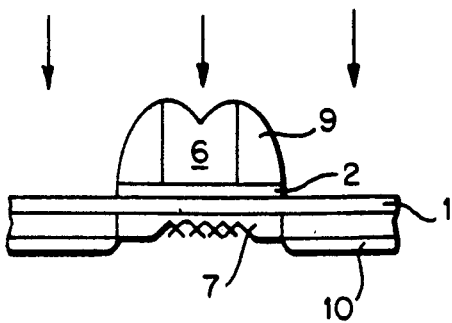
Figure 2A:
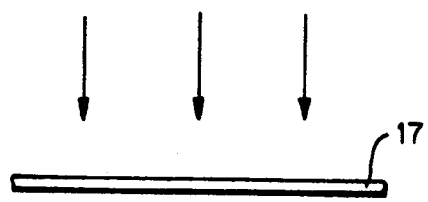
FIGS. 2(a)-(g) are schematic diagrams clarifying the specific manufacturing steps of the semiconductor device according to the present invention.
Figure 2B:
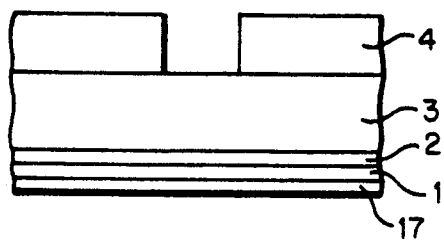
Figure 2C:
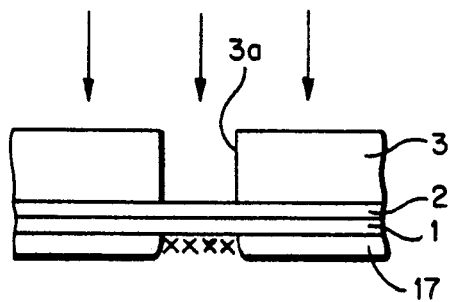
Figure 2D:
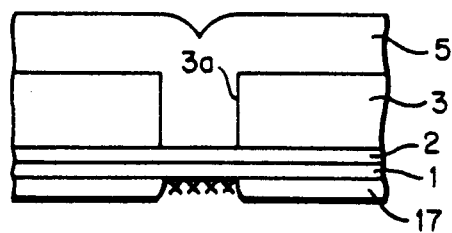
Figure 2E:
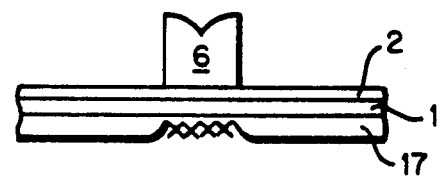
Figure 2F:
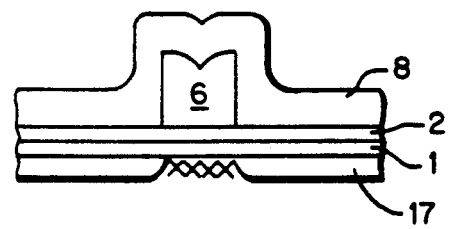
Figure 2G:
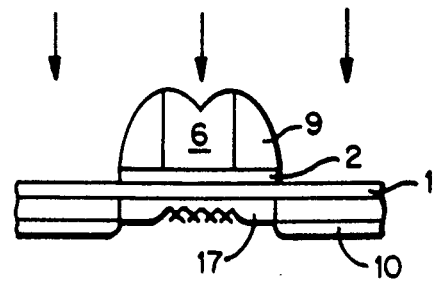

As insulating film 8 of SiO$_2$ and 0.06 μm in thickness was then deposited (FIG. 1(e)) and etched back to leave an insulating film 9 only on the sides of the polysilicon gate 6, forming a sidewall of the gate (See FIG. 1(f)).

The thin polysilicon film 2 was etched by using the sidewall 9 as a mask and arsenic (n-type impurity) was applied at 50 Kev and doses of $5 \times 10^{15}$ ions/cm$^2$ using the sidewall as a mask to form n-type high carrier density region 10 on the substrate (See FIG. 1(f)).

The gate electrode 6 was then provided with wiring by sputtering process to complete an insulating gate type of field effect NMOS transistor having the gate/drain overlapping structure.

In the above embodiment, formation of the (n-type low carrier concentration area 17 by implanting phosphoras n-type impurity) in advance all over the surface of the si substrate at 40 KeV and at the dose of $3 \times 10^{13}$ ions/cm$^2$ allows the omission of ion implantation shown in FIG. 1(d). (see FIG. 2(a)-(g)

As seen from the above, the present invention provides a transistor which is superior in resistance to hot carrier to be of higher reliability thanks to the gate/drain overlapping structure. Also, channel implanatation is carried out only at the channel region, so that density of impurity at the junction of source and drain is not required to be unnecessarily increased, thereby allowing junction leakage to be reduced. Junction capacitance can be also reduced effectively.

Furthermore, the invention uses the self-alignment process wherein formation of the gate/drain overlapping structure and channel implanatation only under the gate electrode are carried out by a single photolithographic process, so that decrease of cost to produce and increase of yield can be achieved thanks to reduction of the total number of specific processes. Also, a single photolithographic process may be carried out for both of the channel implantation and polysilicon gate forming, thereby enabling the insulating gate type of field effect transistor to be provided in the self-alignment manner.

What we claimed is:

1. A process for manufacturing a semiconductor device which comprises the following steps of
    (i) forming a first insulating film on the whole surface of a semiconductor substrate having thereunder a thin conductive layer with an intervening gate insulating film in which the semiconductor substrate is implanted with impurity ions of a first conductivity type before forming said first insulating film, said thin film conductive layer and said intervening gate insulating film,
    (ii) removing the first insulating film at a channel region to cause the thin conductive layer to be exposed, thereby forming an opening portion,
    (iii) implanting ions of a second conductivity type in the opening portion to set a threshold value of the transistor in the substrate,
    (iv) forming a gate electrode of a conductive material in the opening portion,
    (v) removing only the first insulating film while leaving the gate electrode,
    (vi) layering a second insulating film on the substrate including the gate electrode and then carrying out an aniosotropic etching to build a sidewall of the gate electrode, and
    (vii) implanting ions by use of the gate electrode and its sidewall as a mask to form a high carrier density region on the substrate.

2. A process for manufacturing a semiconductor device as set forth in claim 1, wherein the step (iv) for forming a gate electrode of a conductive material involves depositing a thick polysilicon layer on the whole surface of the substrate including the opening portion and then etching back the substrate, thereby forming the gate electrode.

3. A process for manufacturing a semiconductor device as set forth in claim 1, wherein the step (iv) for forming a gate electrode of a conductive material involves selectively causing tungsten or other conductive material to be grown in the opening portion, thereby forming the gate electrode.

4. A process for manufacturing a semiconductor device as set forth in claim 1, wherein the thin conductive layer in step (i) is formed of poly Si or α-Si.

5. A process for manufacturing a semiconductor device as set forth in claim 1, wherein the conductive type of impurity ions implanted in step (iii) are opposite to that of the impurity ions implanted in step (i) and step (vii).

* * * * *